United States Patent [19]
Houghton et al.

[11] Patent Number: 6,075,700
[45] Date of Patent: Jun. 13, 2000

[54] METHOD AND SYSTEM FOR CONTROLLING RADIO FREQUENCY RADIATION IN MICROELECTRONIC PACKAGES USING HEAT DISSIPATION STRUCTURES

[75] Inventors: Christopher Lee Houghton, Westborough; Colin Edward Brench, Stow, both of Mass.

[73] Assignee: Compaq Computer Corporation, Houston, Tex.

[21] Appl. No.: 09/241,351

[22] Filed: Feb. 2, 1999

[51] Int. Cl.[7] ....................................................... H05K 7/20
[52] U.S. Cl. .......................... 361/704; 361/707; 361/709; 361/719; 257/706; 257/712; 257/713; 257/718; 257/719; 174/15.2; 174/16.3; 174/51; 165/80.2; 165/80.3; 165/80.4
[58] Field of Search ..................................... 361/687–689, 361/698–700, 704, 707, 709, 714, 715, 719–721, 816, 818; 257/707, 706, 713–719; 165/80.2–80.4, 18.5; 174/15.1, 15.2, 16.3

[56] References Cited

U.S. PATENT DOCUMENTS

| | | | |
|---|---|---|---|
| 5,175,613 | 12/1992 | Barker, III et al. ...................... | 257/713 |
| 5,317,107 | 5/1994 | Osorio ..................................... | 174/52.4 |
| 5,541,811 | 7/1996 | Henningsson et al. ................. | 361/704 |
| 5,566,052 | 10/1996 | Hughes ..................................... | 361/704 |
| 5,703,753 | 12/1997 | Mok ......................................... | 361/715 |
| 5,796,170 | 8/1998 | Marcantonio ............................ | 257/786 |
| 5,866,943 | 2/1999 | Mertol ..................................... | 257/712 |
| 5,880,930 | 3/1999 | Wheaton .................................. | 361/690 |
| 5,930,115 | 7/1999 | Tracy et al. ............................. | 361/704 |

OTHER PUBLICATIONS

Montrose, Mark I., "Printed Circuit Board Design Techniques for EMC Compliance," IEEE Electromagnetic Compatibility Society, IEEE Press, 1996.

*Primary Examiner*—Leo P. Picard
*Assistant Examiner*—Boris L. Chervinsky
*Attorney, Agent, or Firm*—Hamilton, Brook, Smith & Reynolds, P.C.

[57] ABSTRACT

A method and apparatus are disclosed for attenuating RF noise produced by electronic systems by providing low RF impedance shorting of heat dissipating structures, such as heat sinks, to PCB reference planes. The RF impedance shorting path uses existing package pins with dedicated electrical paths through the package to the bottom surface of the heat sink. Such an arrangement provides very low RF impedance because of the minimal length and resistance of the shorting path, and also provides minimal disruption of the PCB design rules and tolerances by using existing package leads.

4 Claims, 5 Drawing Sheets

METHOD AND SYSTEM FOR CONTROLLING RADIO FREQUENCY RADIATION IN MICROELECTRONIC PACKAGES USING HEAT DISSIPATION STRUCTURES

BACKGROUND OF THE INVENTION

As is known in the art, any change in voltage or current on an electronic signal line causes radiation to be emitted. Slowly shifting currents and voltages cause small amounts of radiation at very long wavelengths, and very rapid changes in voltage or current cause large amounts of short wavelength radiation to be emitted. In general, radio frequency (RF) radiation from integrated circuits (ICs) is a problem because RF radiation is easily detected by outside radio receivers, and is also energetic enough to cause measurable voltage changes on signal lines in other nearby electronic devices.

An electronic device, such as a microprocessor, has numerous signal lines whose electrical states are shifting up and down by as much as 5 volts at MegaHertz to GigaHertz frequencies. Electronic devices include individual ICs, such as memory chips, microprocessors, cross bar switches and logic arrays, multichip modules containing several IC chips, hybrid modules connecting active ICs with passive electrical components such as resistors and capacitors, and electronic systems with circuit boards and back planes connecting the circuit boards and the electronic devices on the circuit boards. The high speed voltage shifting of the signal paths creates RF radiation, at least some of which escapes from the electronic package containing the electronic device and may be detected by nearby radio receivers, or cause unintended voltage changes in nearby electronic devices. Such unintended voltage changes may be of a large enough magnitude to be mistakenly interpreted as a change in a logic state, thus resulting in a logic failure of the nearby electronic device. As a result of these problems, RF emissions from electronic devices must be kept below levels dictated by FCC regulations.

Although RF radiation is emitted by any rapidly changing signal line, the strength of the emitted radiation also depends on the antenna characteristics of the emitting signal line. A typical electrical conductor on an integrated circuit (IC) is not an efficient antenna. A strip of conductive material on the IC is neither a proper dipole antenna nor a quarter wave length monopole at typical RF frequencies. There are many other conductors on the IC having different voltages and phases in extremely close proximity to the emitting signal line. Each of these other conductors is likely to be emitting radiation as well, thus each signal line may represent a radiation shield or a counterbalance to the radiation of the others. In modern microprocessors the synchronized clock lines may produce RF interference at the clock frequency.

However, it is well known that modern high speed ICs have a need to keep the temperature of the semiconductor junctions to a low level for reasons of long term reliability. The semiconductor material of an IC is typically contained within an electronic package that protects the IC and provides electrical connections from the IC to the printed circuit board (PCB) upon which the IC is mounted. The same situation is also true of hybrid packages, and other types of electronic systems.

A typical method used for cooling ICs and other electronic devices is to attach a heat dissipative structure, such as a heat spreader or a heat sink, to the IC's electronic package. Many methods of attaching heat sinks to electronic packages are known in the art, and include glues, spring clips, and other physical attachment means such as bolts and studs. The glues used include various cyano- and methylmethacrylates, dual and single component epoxy compounds, either liquid or solid, or preformed semisolid epoxy shapes. The epoxy or other glue may be filled with a thermally conductive material, such as silver particles, to improve the thermal conduction, and many single component epoxy products require a heat treatment step to activate the heat sink to package adhesion. Physical heat sink attachment methods may use a compliant thermally conductive medium between the heat sink and the electronic package to fill any air gaps. Heat spreaders may be built into the package or may be attached to the outside of the electronic package by means of soldering, welding or brazing the metallic heat spreader to a metallized portion of the package.

A typical electronic package is composed of a nonconductive material (known as dielectric), such as ceramic or plastic, to allow the electrical signals from the IC to pass along conductors provided within the dielectric of the electronic package, and to the PCB without attenuation and inter-conductor interference. However, most dielectric materials are also poor heat conductors, i.e., they are thermal resistors, and thus a thermal gradient will exist if a heat sink is simply attached to the electronic package. Therefore, it is known to provide another type of heat dissipative structure, called a metallic slug or a thermal slug, that traverses part of the electronic package. The slug provides a better thermal path through the dielectric of the electronic package, and thus improves the thermal conduction path between the backside of the IC and the heat sink. The slug thus reduces the thermal resistance between the heat sink and the IC. Such metallic slugs are typically made of copper for plastic packages, or of a copper/tungsten alloy for ceramic packages.

In either of the above situations, the presence of a heat sink may change the efficiency with which the radiation is emitted. The heat sink will have an RF voltage caused by inductive coupling between the heat sink and the IC or other electronic device. The case discussed above of a heat sink with a metallic slug will provide closer coupling and hence possibly greater transmitted RF radiation levels. The heat sink is a better antenna because of the size of the heat sink relative to the IC signal lines. A heat sink may become an efficient antenna at a system operating clock frequency of about 300 MegaHertz (MHZ) for large sized heat sinks. The heat sink is also not shielded by other signal radiators and it may be a dipole antenna. The metallic heat sink is one dipole arm, with the ground plane of the PCB boards as the second arm. To complete the antenna model there are ground radials formed by the IC power and ground voltage lines. Thus the industry solution to the overheating problem in high speed ICs unintentionally results in an increase in RF noise radiated from the IC.

It is also known in the art to provide grounded conductive shields either totally or partially surrounding, i.e., external to, the heat sink and IC package to reduce the level of emitted RF noise. Shield plates are typically placed as close to the heat sink as possible without making electrical contact to provide the maximum shielding. This is because the shields form what is known as an image charge which contains the RF noise. The closer the shields are located to the radiating source the better the coupling and the closer the image charge will be to exactly canceling out the RF noise.

There exists a problem in the art with external shields. Each shield must be connected as closely as possible with the PCB reference plane (typically the ground plane) so as to provide the lowest RF impedance for optimal image charge formation. Typically, each of the shields will have numerous connections (typically made by solder joints) to the PCB board to minimize unwanted resistance. The requirement of close electrical connection to the PCB results in increased PCB size and complexity, and consequent increases in finished electronic device cost. The physical presence of the shields on the PCB results in an increased distance between components, for example between a microprocessor and its associated cache memory, and the shields may obstruct cooling air flow and result in IC overheating. The increased physical distance between components on the PCB results in a decrease in device speed due to increased time of flight of the electronic signals, increased parasitic capacitance and signal line mutual and self inductance problems.

It is also known in the art to provide an electronic system with a box or enclosure that is grounded to a reference plane to form what is known as a Faraday shield. The shielded box prevents RF radiation from leaving the system and affecting surrounding devices, and also prevents outside Rf radiation from affecting the system. However, such Faraday shields are expensive to provide since the size of the allowable cooling air holes in the shield must be small enough to block the RF noise generated by the system, and the trend in the industry toward higher frequency system operation means that the hole size will continue to drop. Such shields also fail to attenuate RF radiation between individual components of the same system.

It is also known in the art to provide the heat sink with electrical connections directly to the PCB reference plane by attaching metallic posts from the four corners of the heat sink to solder pads on the PCB directly below the heat sink. This method requires additional manual assembly operations be added to the IC attachment to the PCB. It also requires additional space on the PCB for the post attachments, and is practical only in cases where heat sink is substantially larger than the IC package.

Therefore it would solve a problem in the art to provide a heat sink RF shielding device that did not require additional connections to the PCB ground plane beyond those provided by the electronic package, did not decrease the density of the PCB, or increase PCB assembly costs by requiring tighter assembly tolerances.

SUMMARY OF THE INVENTION

The invention provides reduced electronic device RF radiation by providing dedicated paths within an electronic package between a heat dissipative structure, such as a heat sink, and an RF reference, such as the PCB ground plane. With such an arrangement the two halves of the parasitic antenna are effectively shorted together and the efficiency of the parasitic heat sink antenna is greatly reduced.

In a preferred embodiment, an IC device in a package having either an attached or an integral electrically conductive heat dissipating structure has at least one of the package connectors, for example pins or leads, dedicated to an electrical connection to the heat dissipating structure. The heat dissipater is connected, preferably as directly as possible, to the dedicated package connection.

In another embodiment of the invention, an IC package having a heat spreader attached to the top surface of the package, preferably by a brazing process, is connected to selected package leads by at least one top surface electrical connection. The heat sink is attached to the heat spreader, such as by nuts on threaded bolts protruding from the heat spreader, with a layer of electrically conductive material between the heat sink and the heat spreader acting to improve the electrical and thermal connection. The heat sink is electrically attached through the package body and package leads to a circuit board and to a RF reference plane of the circuit board.

In still another embodiment of the invention, a heat sink is attached to the IC package using an electrically conductive adhesive. The adhesive electrically connects the heat sink to at least one top side package electrical connection that is designed to be under the heat sink area, and thereby electrically connecting the heat sink to the package leads and the circuit board reference plane.

In yet another embodiment of the invention, a heat sink having a pedestal region for attachment to the IC package that is smaller than the remaining portion of the heat sink, is electrically connected from at least one electrical contact on the package that is not under the pedestal, to the heat sink by an electrically conductive spring attached to the package.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
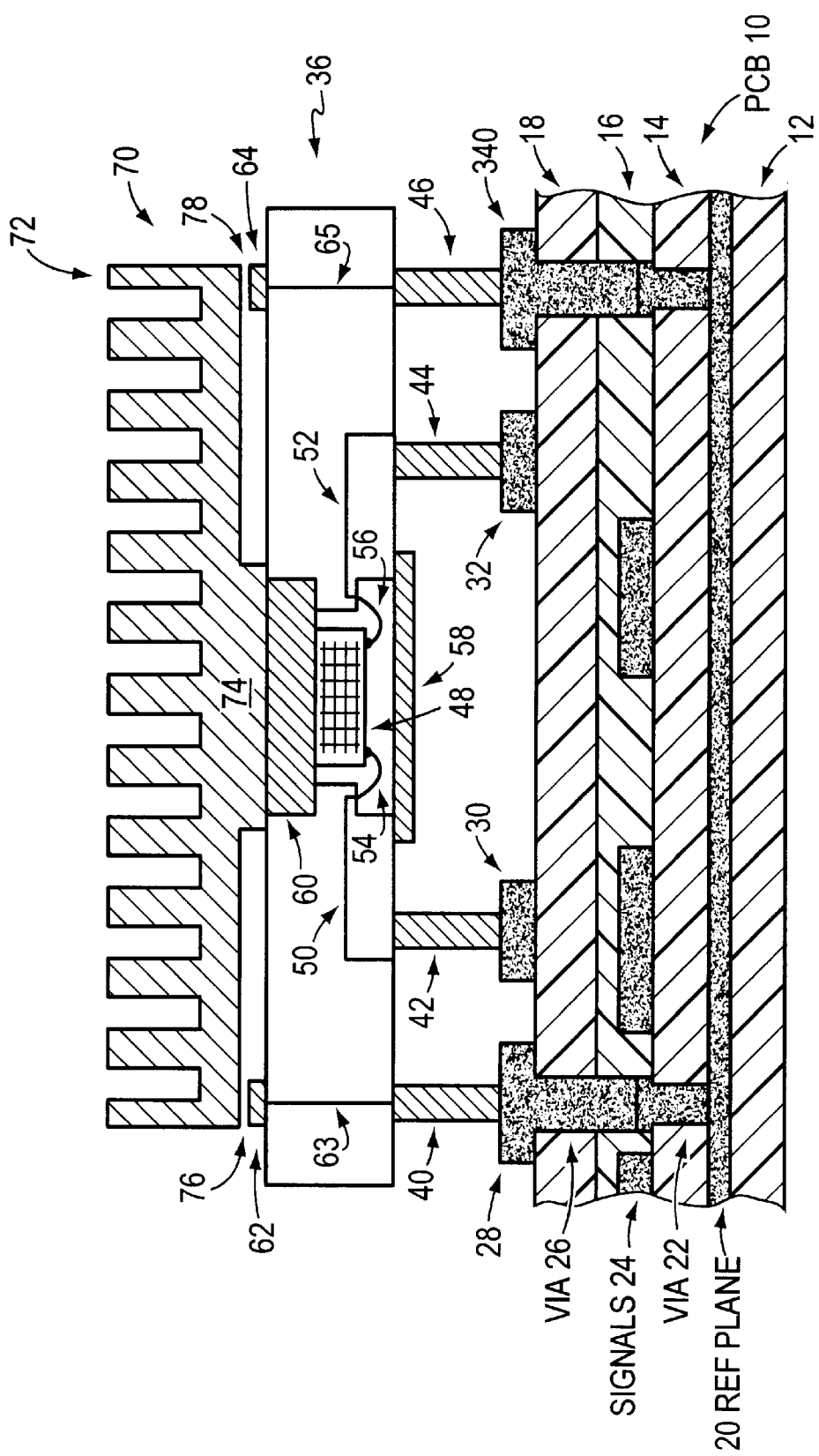
FIG. 1 is a cross sectional view showing a package with a heat sink electrically connected to a printed circuit board according to the invention.

Referring to FIG. 1, a printed circuit board (PCB) 10 is illustrated, having a number of insulating layers 12, 14, 16 and 18, which provide insulation between various conductive signal, power, and ground lines and layers. The insulating layers may be made of a plastic such as polyimide, or of a glass-filled polymer such as FR4. In the illustrative example, the PCB 10 is a motherboard carrying the system processor or some other heat producing circuit in a package 36. The package 36 is connected both physically and electrically to the PCB 10 by connectors 40–46, in this example surface mount butt joints. Layer 20 is one of a plurality of voltage reference levels at DC and RF frequencies found in typical PCBs. In this illustration layer 20 is a ground plane. Layer 20 passes through insulator 14 by means of via conductor 22 and reaches the signal conductor layer. Signal layer 24 contains various conductors that transmit electrical signals through the PCB and between electrical devices mounted upon or connected to the PCB. The ground connection next passes through insulator layer 16 by means of via 26 and reaches the top level of the PCB 10, which contains signal conductors and bonding pads 28, 30, 32, and 34 for connection to an electrical device such as integrated circuit (IC) package 36.

Typically, the bonding pads 28–34 are attached to the package 36 by means of soldering package pins 40, 42, 44 and 46 to the bonding pads. Many different techniques for attaching devices such as IC package 36 to PCB 10, however, are known in the art, and include surface mount technologies such as ball grid arrays (BGA) in which the connectors 40–46 would be solder balls, butt joint pin grid arrays (PGA) such as shown in package 36, peripheral leaded chip carriers (PLCC, CLCC, PQFP), leadless chip carriers (LCC), and direct chip attach. The invention is adaptable to these and other IC package technologies, including wave soldered through hole pin grid arrays. The solder joints are typically made by either wave soldering or reflow of a paste made of Lead/Tin solder in a flux base.

The package connectors or pins 42 and 44 in this illustrative embodiment are shown to be signal pins that communicate with an IC 48 by means of IC package internal conductors 50 and 52, and by means of wire bonds 54 and 56. Many different means of connecting IC chips to IC packages are known in the art, such as tape automated bonding (TAB), flip chip, and beam leads. Wire bonds 54 and 56 may be gold or aluminum wire with attachment s made by wedge or ultra sonic bonding.

The IC 48 is held in this illustrative example, in a cavity with package 36 and protected by cover 58 from the environment. IC 48 is attached to a primary heat dissipative structure 60 known as a thermal plug, by any of the means well known in the art, such as eutectic bonding, epoxy or other adhesives. In any case, typically the attachment is thermally conductive and probably electrically conductive as well. Generally, thermal plugs are of copper for plastic packages and copper tungsten for ceramic packages.

Pins 40 and 46, in this illustrative embodiment, are not IC signal pins but are disposed to connect the reference plane 20 via internal signal lines 63 and 65 to external connectors or pads 62 and 64, which are disposed upon the top external surface of the package 36, in this illustrative example.

Connections 62 and 64 are intended to connect to a secondary heat dissipative structure 70, known as a heat sink, in the following fashion. Heat sink 70, here shown as a unidirectional heat sink for purposes of illustration, has fins 72 for dissipating heat and pedestal region 74 for attaching the heat sink to the thermal plug 60. Heat sinks are typically made of aluminum, and may have an anodized surface to retard corrosion. Note however that the invention is not dependent upon either the presence of the pedestal or of the thermal plug. The spaces 76 and 78 between the connections 62 and 64 and the heat sink are filled with by means of reflowed solder paste or brazing material in this illustrative example. Alternatively, the spaces 76 and 78 may have a conductive spring clip or wire. Such spring clips are typically of copper beryllium alloy and may be soldered to the pads 62 and 64.

In a preferred embodiment the pins 40 and 46 are chosen to be at the corners of the package and around the package perimeter to form a Faraday cage or shield, and the connections 62 and 64 will have as straight and short a path 76 and 78 as possible to provide the less possible RF impedance for the path to ground. In the preferred embodiment the spacing between adjacent pads of the Faraday cage is selected based on the frequency of RF noise that is to be suppressed.

Figure 2:
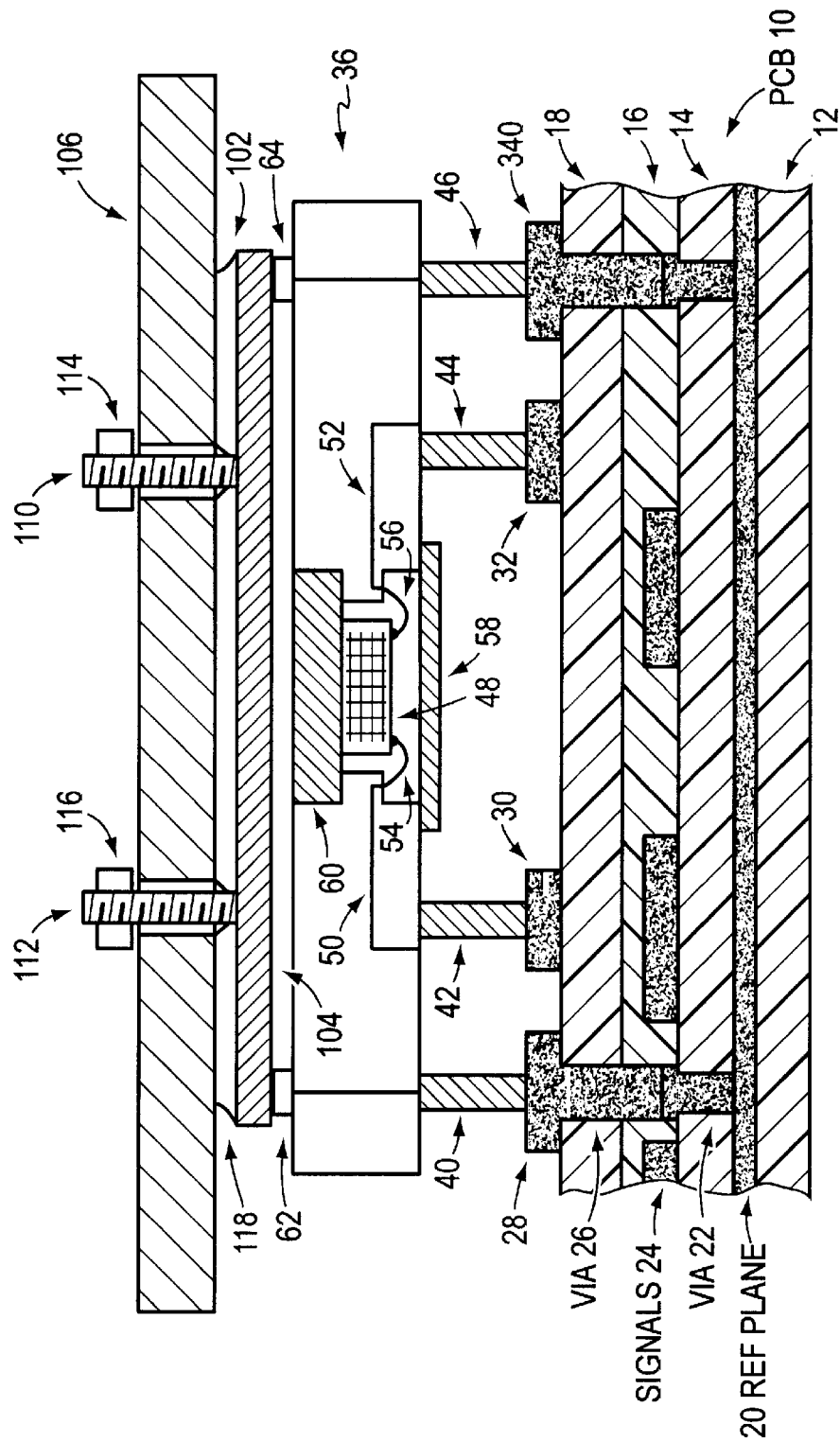
FIG. 2 is a cross sectional view of a package having an attached heat spreader and heat sink according to another embodiment of the invention.

Referring now to FIG. 2, the package 36 is shown having an intermediate heat dissipative structure 102, known as a heat spreader, directly brazed to connections 62 and 64 using brazing material 104. Heat spreaders are typically made of tungsten copper alloy. A flat heat sink 106 is shown attached to heat spreader 102 by threaded studs 110 and 112 and nuts 114 and 116. To ensure good thermal contact between heat sink 106 and heat spreader 102, a thermally conductive compliant material 118 such as graphite or certain oils is placed in any space that results from attachment of heat sink to heat spreader due to surface irregularity or nonplanarity. Any type of heat sink or heat dissipative structure, such as a heat pipe, may be used with the invention. Heat pipes are hollow heat sink shaped devices that have improved heat flow due to the boiling of a contained cooling fluid, such as Freon™, at the package surface, and the recondensation of the cooling fluid at the fin end of the heat pipe. Heat pipes may have an internal wick structure to allow greater latitude in heat pipe position.

Figure 3:
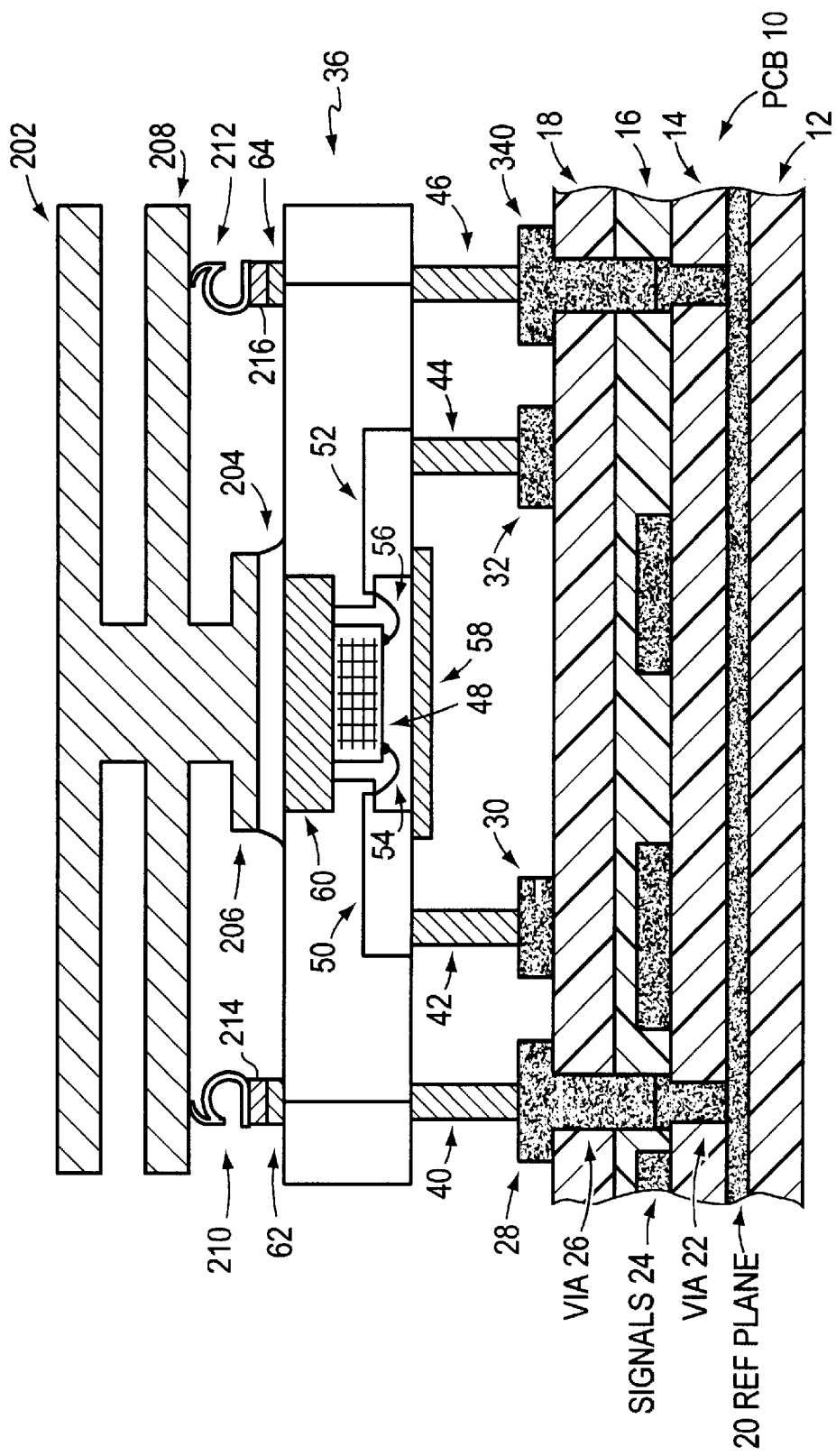
FIG. 3 is a cross section of a package having an adhesive-attached heat sink and a spring-connection between the package and heat sink according to yet another embodiment of the invention.

FIG. 3 shows heat sink 202, shown for purposes of illustration as an omnidirectional heat sink, attached to the package 36 by means of epoxy layer 204 attached to heat sink pedestal 206. The heat sink fins are electrically connected to connections 62 and 64 by spring clips 210 and 212. In a preferred embodiment, the spring clips are attached first to the pads 62 and 64 by soldering, forming solder joints 214 and 216. The spring clips would electrically contact the heat sink 202 by means of sharp teeth on the ends of the springs. The case of anodized aluminum heat sinks may require that the anodization layer be removed from a portion of the bottom of the heat sink fin that will contact the spring clips 210 and 212, if the sharp tip of the spring is found to be insufficient to puncture the thin anodization layer. On the other hand, the thin walls of a heat pipe may be punctured or eroded by the action of vibrations upon the spring clip's sharp tip, resulting in loss of coolant fluid, and thus require a blunt tip on the spring clip or a thick.

Figure 4:
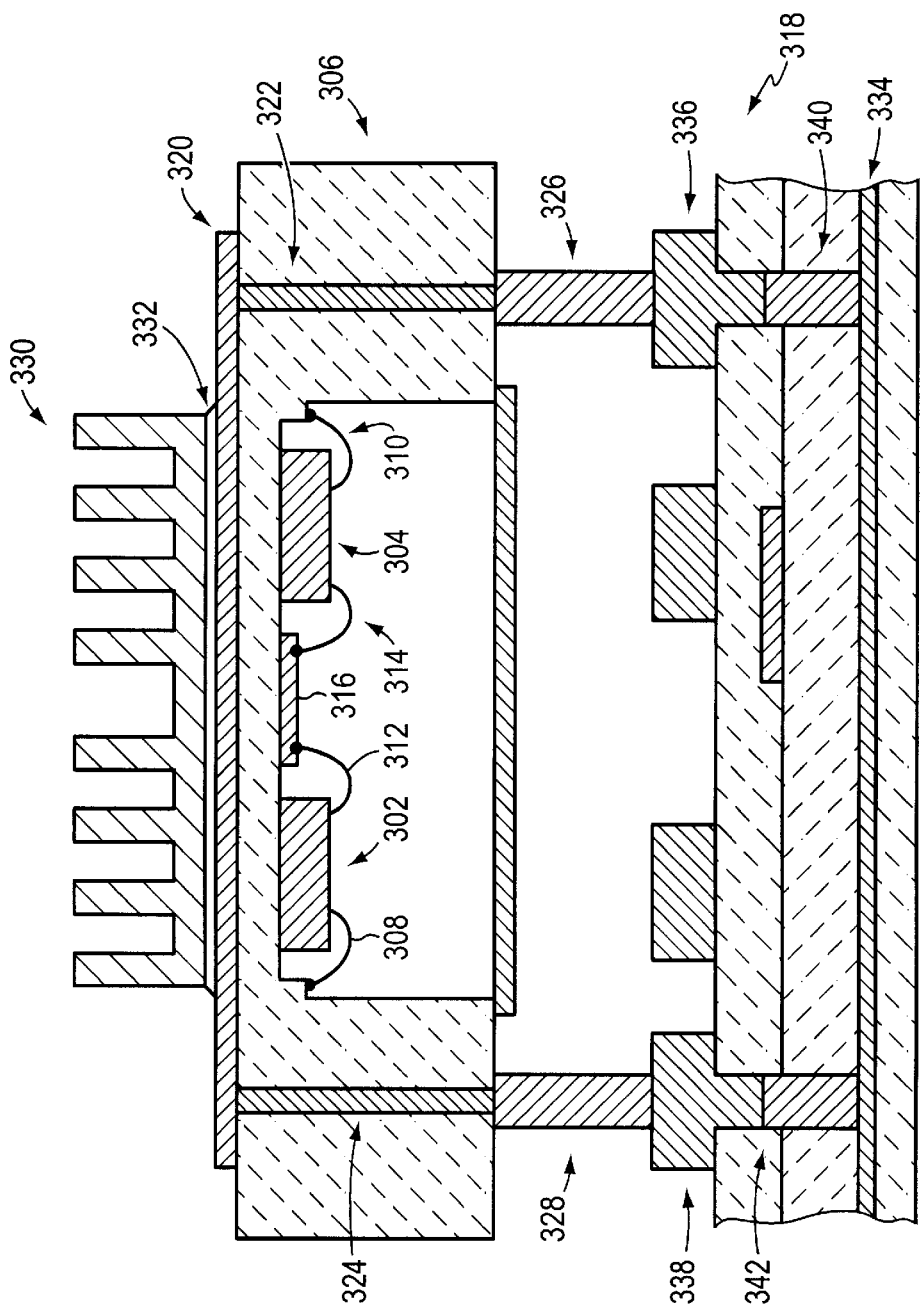
FIG. 4 is a cross sectional view of a multichip package having a heat sink in accordance with still another embodiment of the invention.

FIG. 4 shows a cross sectional view of a multichip embodiment of the invention. IC chips 302 and 304 are connected to the multichip package 306, shown as a ceramic material in this example, by wire bonds 308 and 310. Other well known methods of attaching ICs to package, such as flip chip or TAB bonding may also be used. The ICs 302 and 304 are also connected to each other in this illustrative embodiment by wire bonds 312 and 314 through package conductor 316. The package conductor 316 may also be a resistive element as is well known in the art. The package 306 is shown attached to circuit board 318, shown in this illustrative embodiment as being comprised of a ceramic material, in any of the well-known methods discussed above. The package 306 is cooled in this example by a heat spreader 320 which is attached to the package 306 and two top side electrical connectors 322 and 324, which connect the heat spreader to output connectors 326 and 328, and thus to circuit board 318. Heat sink 330, here shown as a unidirectional heat sink, is attached to heat spreader 320 by an electrically conductive material 332, preferably a brazing compound. Thus, the heat sink 330 is connected to the circuit board 318 RF reference plane 334, in this example a ground plane, by the heat spreader 320, the package conductors 322 and 324, the package connectors 326 and 328, and the circuit board conductors 336 and 338, and vias 340 and 342.

Figure 5:
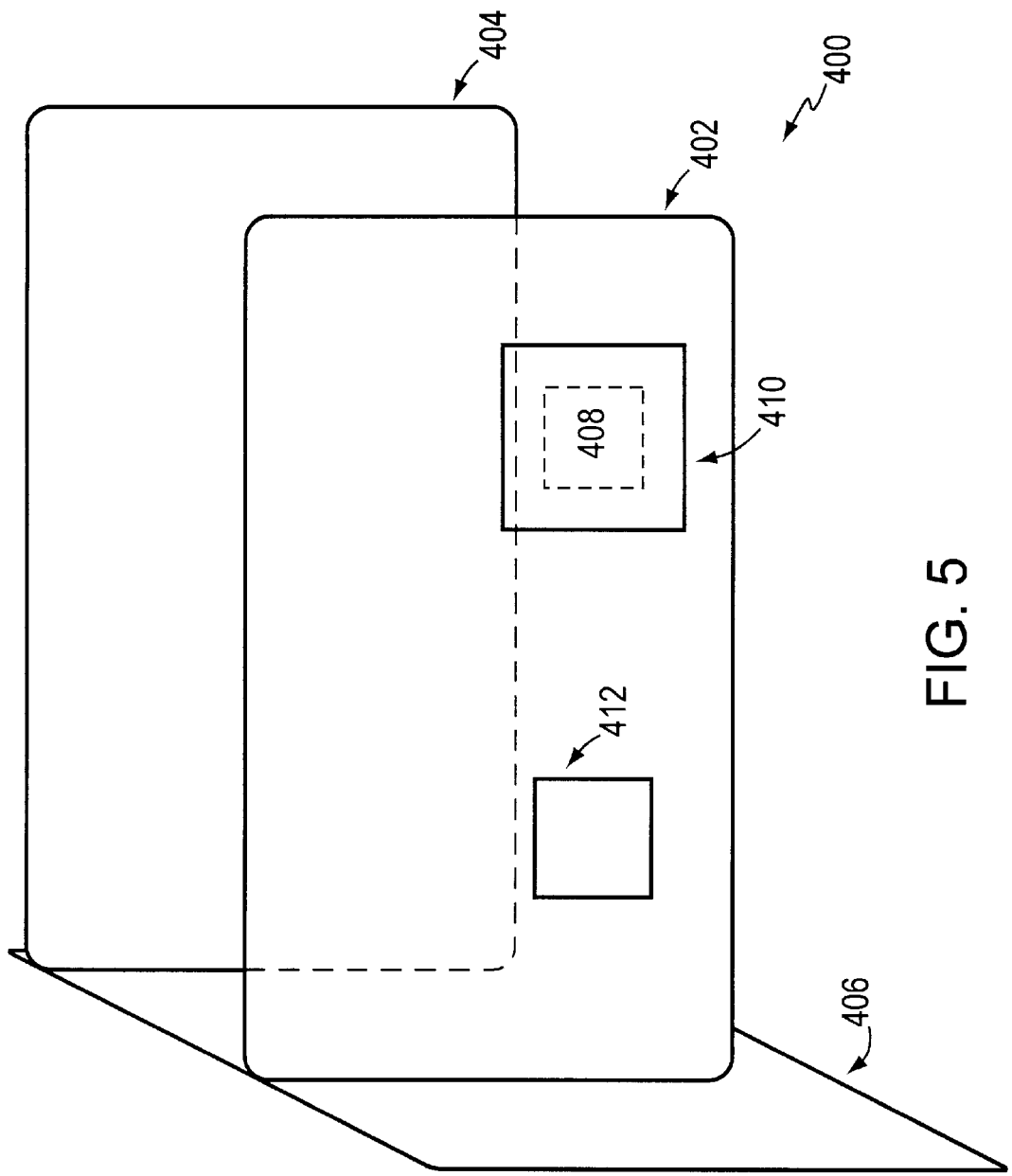
FIG. 5 shows a system having several circuit boards.

FIG. 5 shows two representative circuit boards 402 and 404 of a system 400, interconnected by a backplane 406. Board 402 has a microprocessor 408 having an overlapping heat sink 410, connected to a ground plane in board 402 through the IC 408 package in accordance with the invention. IC 408 is connected through the circuit board 402 to another IC 412, for example a cache memory or input/output controller. The board 404 contains other parts of the total system 400, for example a memory system or a power and ground source. The invention protects ICs on board 404 from RF interference generated by the IC 408 on board 402, without requiring additional connections between the heat sink 410 and the board 402. If direct connections where made between the heat sink 410 corners and the board 402 by means of direct conductive pillars, as is known in the art, then the conductors of board 402 would have to be rerouted around the pillar mounting pads, and the area under heat sink 410 would not be available for the placement of smaller ICs.

The invention shorts out the radiation impedance of the heat sink, which is basically an antenna at present IC operating rates. It is clearly desirable to use as many connections as possible around the perimeter of the IC package to improve the performance of the resulting Faraday cage, but the four corner pins have been found to have a good effect. With the four pin arrangement it is possible to reduce the amount of radiated RF noise by 40 to 60 dB over the same device and package without the four corner RF ground paths. The average RF voltage drop between the edges of the heat sink to the PCB ground reference plane has been found to be less than 100 micro-volts. It is also possible to connect the heat sink to the internal package ground planes rather than the PCB ground reference plane, but the variations in ground potential found inside many high current IC package could significantly degrade the performance of the shield.

There are many IC packages already available that have groups of two top side connections into the package such as those described herein. Such top side connections are typically used to attach what are known as chip capacitors. In certain cases one of the two connections is connected directly to a package pin that goes to a PCB power supply. Such direct connections to the PCB may be used by the present arrangement to connect the described spring clip, preferably by soldering, thereby avoiding the need to design a special package.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An apparatus for reducing radiation from an electronic device comprising:

a package connecting an electronic circuit to a circuit board via a plurality of connectors;

a conductive heat dissipative heat spreader structure on an outside surface of the package; and the package providing at least one electrical connection between the conductive heat dissipative heat spreader structure and the circuit board using at least one of the plurality of connectors;

wherein the heat spreader is connected to the package by a brazing process, the heat spreader having threaded studs brazed thereon, and a heat sink connected by nuts to the heat spreader.

2. The apparatus of claim 1 wherein further a thermally conductive compliant material is disposed between the heat sink and the heat spreader.

3. An apparatus for reducing radiation from an electronic device comprising:

a package connecting an electronic circuit to a circuit board via a plurality of essentially identical connectors;

a conductive heat spreader connected to an outside surface of the package by a brazing process, the heat spreader having threaded studs brazed thereon, and a heat sink connected by nuts to the heat spreader; and the package providing at least one electrical connection between the heat sink to at least one of the plurality of connectors.

4. The apparatus of claim 3 wherein further a thermally conductive compliant material is disposed between the heat sink and the heat spreader.

* * * * *